United States Patent
Marshall

(10) Patent No.: US 7,794,538 B2
(45) Date of Patent: Sep. 14, 2010

(54) SELF-ASSEMBLY METHOD, OPAL, PHOTONIC BAND GAP, AND LIGHT SOURCE

(76) Inventor: Robert A Marshall, 324 Doe Run, Georgetown, TX (US) 78628

( * ) Notice: Subject to any disclaimer, the term of this patent is extended or adjusted under 35 U.S.C. 154(b) by 1009 days.

(21) Appl. No.: 11/307,328

(22) Filed: Feb. 1, 2006

(65) Prior Publication Data

US 2006/0175380 A1    Aug. 10, 2006

Related U.S. Application Data

(63) Continuation-in-part of application No. 11/049,025, filed on Feb. 2, 2005.

(51) Int. Cl.
*C30B 1/00* (2006.01)
*C30B 28/02* (2006.01)
*B32B 3/26* (2006.01)

(52) U.S. Cl. .......... 117/4; 117/3; 117/69; 117/70; 428/304.4

(58) Field of Classification Search .......... 117/3–4, 117/69–70, 200; 359/341.5; 428/304.4, 428/426
See application file for complete search history.

(56) References Cited

U.S. PATENT DOCUMENTS

| | | | |
|---|---|---|---|
| 5,998,298 A | 12/1999 | Fleming et al. | |
| 6,139,626 A | 10/2000 | Norris et al. | |
| 6,297,496 B1 | 10/2001 | Lin et al. | |
| 6,325,957 B1 | 12/2001 | Kumacheva et al. | |
| 6,358,854 B1 | 3/2002 | Fleming et al. | |
| 6,388,795 B1 | 5/2002 | Fleming et al. | |
| 6,409,907 B1 * | 6/2002 | Braun et al. | 205/317 |
| 6,414,332 B1 | 7/2002 | Lin et al. | |
| 6,517,763 B1 | 2/2003 | Zakhidov et al. | |
| 6,521,541 B2 * | 2/2003 | Rossi | 438/710 |
| 6,583,350 B1 | 6/2003 | Gee et al. | |
| 6,611,085 B1 | 8/2003 | Gee et al. | |
| 6,768,256 B1 | 7/2004 | Fleming et al. | |
| 6,812,482 B2 | 11/2004 | Fleming et al. | |
| 6,858,079 B2 | 2/2005 | Norris et al. | |
| 6,869,330 B2 | 3/2005 | Gee et al. | |
| 7,045,195 B2 * | 5/2006 | Ozin et al. | 428/173 |
| 7,063,938 B2 * | 6/2006 | Yang et al. | 430/322 |

(Continued)

FOREIGN PATENT DOCUMENTS

WO  PCT/US2006/003829   2/2006

OTHER PUBLICATIONS

"A three-dimensional photonic crystal operating at infrared wavelengths". Nature, 1998, vol. 394, p. 251.

(Continued)

*Primary Examiner*—G. Nagesh Rao

(57) ABSTRACT

A suspension of particles is rapidly self-assembled with a minimal number of defects into a three-dimensional array of particles onto a substrate under simultaneous sedimentating and annealing forces. This array of particles may be ordered as an opal structure. Optionally, the synthesized structure may incorporate an electrolyte into the suspension and be used as a sacrificial form for micromoulding an inverse structure. The inverse structure may exhibit a photonic band gap. Optionally, necking and material composition may be adjusted after micromoulding. These structures are useful to a wide variety of applications. The photonic band gap structure may be heated to function as a light source. The light source may be fitted into standard sockets.

1 Claim, 8 Drawing Sheets

U.S. PATENT DOCUMENTS

| | | | |
|---|---|---|---|
| 7,247,349 B2 * | 7/2007 | Ozin et al. | 427/283 |
| 7,364,673 B2 * | 4/2008 | Arsenault et al. | 252/586 |
| 2002/0023894 A1 * | 2/2002 | Rossi | 216/2 |
| 2002/0045030 A1 * | 4/2002 | Ozin et al. | 428/173 |
| 2003/0148088 A1 | 8/2003 | Padmanabhan et al. | |
| 2003/0156319 A1 | 8/2003 | John et al. | |
| 2004/0053009 A1 * | 3/2004 | Ozin et al. | 428/168 |
| 2004/0118339 A1 | 6/2004 | Papadimitrakopoulos et al. | |
| 2004/0131799 A1 * | 7/2004 | Arsenault et al. | 428/1.26 |
| 2004/0146811 A1 * | 7/2004 | Yang et al. | 430/322 |
| 2006/0175380 A1 * | 8/2006 | Marshall | 228/101 |
| 2006/0244781 A1 * | 11/2006 | Kommera et al. | 347/40 |
| 2007/0196571 A1 * | 8/2007 | Ozin et al. | 427/199 |
| 2007/0254161 A1 * | 11/2007 | Wirth et al. | 428/426 |
| 2008/0224103 A1 * | 9/2008 | Arsenault et al. | 252/519.2 |

OTHER PUBLICATIONS

Paul Braun, Pierre Wiltzius, "Electrochemically Grown Photonic Crystals". Nature, 1999, p. 603, vol. 402.

L. E. Helseth, "Self-Assembly of Colloidal Pyramids in Magnetic Fields". Langmuir, 2005, p. 7276-7279, vol. 21.

Abe Masahiko, et al., "Three Dimensional Arrangements of Polystyrene Latex Particles with a Hyperbolic Quadruple Electrode System", Langmuir, 2004, p. 5046-5051, vol. 20.

Yu Lu, et al., "Growth of Large Crystals of Monodispersed Spherical Colloids in Fluidic Cells Fabricated Using Non-photolithographic Methods", Langmuir, 2001, p. 6344-6350, vol. 17.

Yoshitake Masuda, et al., "Self-Assembly Patterning of Colloidal Crystals Constructed from Opal Structure or NaCl Structure", Langmuir, 2004, p. 5588-5592, vol. 20.

Hiroshi Fudouzi, Younan Xia, "Colloidal Crystals with Tunable Colors and Their Use as Photonic Papers", Langmuir, 2003, p. 9653-9660, vol. 19.

Cefe Lopez, "Materials Aspects of Photonic Crystals", Advanced Materials, 2003, p. 1679, vol. 15.

http://ab-initio.mit.edu/photons/tutorial/.

"Electrochemically grown photonic crystals", Nature, Dec. 9, 1999.

"Self-assembly lights up", Nature, Nov. 15, 2001.

Freymannetal. "Tungsten inverse opals: The influence of absorption on the photonic band structure in the visible spectral region", Appl. Phys. Let., 2004, p. 224-226, vol. 84, No. 2.

J. D. Joannopoulos, R. D. Meade, and J. N. Winn, "Photonic Crystals: Molding the Flow of Light", 1995, Princeton Univ. Press.

S. G. Johnson and J. D. Joannopoulos, "Photonic Crystals: The Road from Theory to Practice", 2002, Kluwer.

El-Kady, "Tunable narrow-band infrared emitters from hexagonal lattices", Photonics and Nanostructures—Fundamentals and Applications 1, 2003, p. 69-77.

M.U. Paralle, "Photonic crystal enchanced narrow band infrared emitters", Applied Physics Letters, Jun. 2002.

Garcia et al. WO 01/86038, Nov. 15, 2001.

* cited by examiner

SELF-ASSEMBLY METHOD, OPAL, PHOTONIC BAND GAP, AND LIGHT SOURCE

RELATED APPLICATIONS

This is a Continuation-In-Part, as application of U.S. application Ser. No. 11/049,025, entitled "Synthetic Opal and Photonic Crystal," filed Feb. 2, 2005.

TECHNICAL FIELD OF THE INVENTION

This invention relates generally to the fields of photonics and microfabrication, more specifically to systems and methods to self-assemble ordered structures, fabricate synthetic opal and inverse opal structures, photonic band gap crystals, and photonic band gap light sources.

BACKGROUND OF THE INVENTION

A Photonic Crystal (PC) is a microstructured material with wavelength- and angle-dependent optical properties. For a Photonic Band Gap (PBG) to exist within a PC, the allowed quantum energy bands must not overlap for some area, and that gap area is the PBG. The PBG may exist in one, two, or three dimensions and in Transverse Electric and/or Transverse Magnetic modes. A complete 3-D PBG is a gap in the allowed quantum states across all propagation directions and polarization modes. The band gap position and gap width may be easily modified to yield desired photonic properties by varying crystal parameters, such as: structural geometry, crystal lattice dimensions, or contrast of indices of refraction between the composite material and vacuum/air. PBG properties are generally fully established within only a few lattice constants. Because of these properties, PBGs are attractive for thermally stimulated emitters for lighting and TPV applications and for sharp filters and lossless waveguides in both telecommunication and optical computing applications. An in-depth overview of PCs, PBGs, and fabrication methods can be found at: Cefe Lopez, "Materials Aspects of Photonic Crystals", Advanced Materials 15, p 1679 (2003) or http://ab-initio.mit.edu/photons/tutorial/.

A complete 3-D PBG may exist in a variety of PC structures. One such structure is a stacked array of rods, known as a woodpile structure. Woodpile structures are fabricated using nanolithographic techniques modified from well-known semiconductor processes. These structures must be painstakingly assembled one layer at a time. For each layer, one must create a pattern, etch a mould, fill a mould, and polish that layer into a plane. In addition, the required feature size for visible emission applications is on the order of 100 nm; state-of-the-art lithography and very exceptional layer-to-layer registration quality control are required. This method is too costly in terms of time, capital, and material to be suitable for most applications. Further reference is available at U.S. Pat. No. 6,358,854 B1 "Method to fabricate layered material compositions". Therefore, a system and method to fabricate low cost PBGs is required.

Another complete 3-D PBG structure is an inverse opal. An inverse opal is the volumetric inverse of an opal. An opal, which is a PC structure without a PBG, is a closely packed array of uniformly-sized spheres. An inverse opal is built by using an opal as a template and filling the residual (interstitial) volume between the spheres themselves with a material whose refractive index contrast to vacuum/air is high. For visible to near-IR light emission applications, the required lattice constants are in the range of 300 nm to 2 µm. Unfortunately, there are currently few suitable methods to economically fabricate materials within this size range. Molecular-based templates are too small, while traditional mechanical manipulations are too large, although they can be useful in microwave applications. Even though natural opal gemstones are of about the right particle diameter, they are impractical due to: too small of crystal domain size, particle size variations, limited availability, and extremely high cost.

Since there are limited templates available that are suitable for micromoulding, one must be synthesized. One method to synthesize an opal structure is via a controlled withdrawal process: taking a colloidal suspension of spheres (typically silica or polystyrene), inserting a substrate into the suspension in order to create a meniscus line, and then slowly evaporating the suspending agent (typically water). The surface tension of the evaporating water at the top of the meniscus line pulls the spheres into a closely packed array no more than a few layers thick, leaving an opal structure of spheres. Variations include angling the substrate and establishing a thermal gradient across the substrate to produce a higher quality sample. Generally, only a few layers are deposited; however, increasing the colloid concentration can result in deposits several layers thick. This is a slow process, taking days to months to grow a sample of commercially-useful size and quality. Faster withdrawal of the substrate results in faster growth rates but at the expense of more defects. Various use of walls, channels, and laser confinement have attempted to produce optical waveguides, couplers and other components. These have been plagued by high defect rates.

Another synthesis process includes centrifuging a suspension of spheres to produce an opal sediment. The centrifugal force packs the spheres into a closely packed array at the bottom of the centrifuge tube. As a result of typical tube geometries, the sediment is very thick and does not cover a large surface area. Domain sizes are small. Since PBG properties are fully developed in only a few lattice constants, thick structures not only cost more due to additional material but also offer no benefit since most applications desire a thin sediment over a relatively larger surface area.

Yet another opal synthesis process includes sedimentation using electrophoresis. A suspension of surface-charged spheres is placed between two plates, and as a voltage is applied between the two plates, the charged spheres are attracted toward the oppositely charged electrode, thereby modifying the sedimentation rate. The electric force may oppose the gravitational force, slowing the sedimentation rate. The slower sedimentation allows an opal to form. Fast sedimentation results in a random sludge. This process is further described in US2003/0,156,319 A1 "Photonic Bandgap Materials Based on Silicon".

Yet another opal synthesis process applies a several kilohertz or greater AC electric field to a colloidal suspension of spheres via four hyperbolic electrodes. The AC field creates standing waves which tend to agglomerate spheres into thin layers with some degree of order. No means is provided to remove defects.

Naturally-occurring opals occur only via slow gravitational settling. Their rarity is a function of relatively uniformly sized naturally occurring silica spheres settling slowly enough to self-order into an opal structure.

Attempts at opal synthesis using a paramagnetic spheres in a magnetic field have not been successful. Only lines of spheres or two-dimensional pyramids containing a very small number of spheres have been produced. Another attempt has added non-magnetic spheres to a ferro-fluid, resulting in a sparse hexagonal structure, stable only under the applied field, not the Hexagonal Close Packed opal structure useful for PBGs.

In all of the above opal structure fabrication methods, high quality samples take a very long time to grow; lower quality samples can be grown faster. The largest samples are on the order of only a few square centimeters. Another limitation is that the opals are very fragile, easily damaged by handling. The opal structures must be dried before they are inverted. Larger area samples tend to crack more due to shrinkage when drying. The spheres may be slightly fused, creating a neck between the spheres, adding structural stability. Necking can have the added benefit of optimizing the width of the band gap. Silica opals are necked by drying the opal structure and then sintering, slightly melting the spheres such that they partly fuse together. Therefore, a system and method to fabricate opal structures quickly, with low defects, large domain size, and at low cost is needed.

An inverse opal structure can be formed from a synthetic opal structure in several ways. One such method starts with an opal structure made with silica spheres. Then, a Chemical Vapor Deposition (CVD) of Si, Ge, or other metal is applied in the interstitial spaces between the spheres, and the silica spheres are then etched out with a hydrofluoric acid solution. This results in a structure exhibiting a complete 3-D PBG. This process does not completely fill the interstitial spaces, creating only a thin layer of material or 'eggshell' around the spheres. Thicker shells are possible, but require notably longer deposition times and are further limited by infiltration of the deposition gas. These thin materials are fragile and are not very thermally conductive. Further disadvantages include the use of toxic CVD gasses and hydrofluoric acid as well as the need for vacuum pressures during processing.

Another method of inverting an opal structure is based on a synthesized polystyrene opal structure. An electroplating electrolyte is infiltrated into the interstitial spaces between the spheres; a CdSe alloy is electro-deposited from the bottom up; and, subsequently, the spheres are removed by dissolution in toluene. The result is a CdSe inverse opal PBG crystal. One disadvantage is the risk of damage to the opal structure when the electrolyte is infiltrated. Further reference is made in "Electrochemically grown photonic crystals"; Nature; Dec. 9, 1999. Therefore, a system and method to fabricate high quality, low-cost inverse opal structures and inverse opal PBG crystals is needed.

Thermal stimulation of a PBG material benefits applications including: lighting, ThermoPhotoVoltaic power generation, and thermal signature modification. Since PBGs modify the available quantum mechanical states within the structure, they do not behave as black bodies when thermally stimulated. Instead they produce a narrowband optical emission. The presence of a PBG modifies the available quantum states and thus the quantum statistical likelihood of emission of a particular wavelength. It is well known that the width of the PBG, and hence the thermal emission spectra, is a function of the structure geometry and of the complex dielectric constant contrast. The quantum mechanical form of Plank's law must be used, as the simplifications used to derive the classical black-body form do not apply. As with any thermal stimulation, the radiated energy is not coherent.

A Tungsten woodpile structure has been thermally stimulated in U.S. Pat. No. 6,583,350 "Thermophotovoltaic energy conversion using photonic bandgap selective emitters". However, fabrication of a woodpile structure is too costly to be commercially accepted in a commodity market. An effective thermally-stimulated inverse opal structure has not yet been disclosed. An 'eggshell' CVD inverse opal structure suffers from a high thermal resistance and may lack a substrate, which is required in direct heating applications. The electro-deposited CdSe inverse opal structure will melt at high temperature and will evaporate in high vacuum.

The PBG is capable of significantly spectrally shaping thermally stimulated emissions. The use of a PBG as a replacement to a filament in a standard incandescent light bulb offers substantial energy savings. Common Tungsten filaments slightly shape the spectral output but have the general characteristic of a black body radiator including significant infra-red emissions. A PBG may have a luminous efficacy of 200 lumens per Watt, whereas a common Tungsten filament is about 17 lumens per Watt. This offers substantial advantage over common Tungsten filaments.

A woodpile PBG light source has been disclosed in "A three-dimensional photonic crystal operating at infrared wavelengths", Nature 394, 251 (1998) and claimed in U.S. Pat. No. 6,768,256 "Photonic crystal light source". It is well known that the position of the PBG is a function of lattice constant. While it appears simple to scale this structure down to visible wavelengths, unfortunately, this requires about 100 nm features and a modified state-of-the-art semiconductor foundry to fabricate. This results in a costly and a lengthy manufacturing process which is not suitable for a commodity market.

Therefore, a method for fabricating a low cost, high quality, high temperature, low vapor pressure PBG suitable for use in a commodity markets is needed.

SUMMARY OF THE INVENTION

In accordance with the present invention, systems and methods to self-assemble ordered arrays of particles, fabricate synthetic opal structures, to fabricate inverse opal structures, to fabricate inverse opal PBG crystals, and to fabricate PBG light sources are provided which address disadvantages and problems associated with other systems and methods.

A synthetic opal structure is fabricated from a colloidal suspension of uniformly-sized polystyrene spheres placed under the simultaneous influence of both sedimenting and annealing forces. The spheres have a surface charge and are paramagnetic. The structure is quickly sedimented with an electric field. Sedimentation rate is easily controlled by the intensity of the electric field. However, it is well known that opal sedimentation speed is inversely proportional to quality. It is well-known that application of an unmodulated magnetic field will align the magnetic spheres into chains or pyramids. Application of a modulated magnetic field pre-orders the spheres before sedimentation and anneals out defects during self-assembly. Concurrent application of a modulated electric field and a modulated magnetic field shakes and aligns the particles, assisting them to self-assemble into the densest possible structure, an opal crystal structure. An advantage is that defects from the rapid sedimentation are quickly and effectively annealed out before becoming fully incorporated into the crystal structure, resulting in an opal crystal with both high quality and a high speed of formation. This reduces fabrication costs. In an alternate embodiment, the magnetic media are reversed: non-magnetic spheres are placed in a magnetic ferro fluid suspending agent. In alternate embodiments, other types of particle materials, non-spherical geometries, layered particles, and surface chemistries are envisioned along with different suspension solution chemistries, and applied sedimentation and annealing forces. In other alternate embodiments, the sedimenting and annealing forces may be combinations of electric, magnetic, gravitational, thermal, mechanical, centrifugal, fluid flow, or other force fields. For example, an electric field may sediment the particles, while the suspending fluid is vibrated to anneal out defects. In another example, an electric field may both sediment particles and may be oscillated to anneal out defects. Optionally, the suspension may contain various concentrations of differing particles: different material composition, different size, and/or different functionality, allowing the formation of many alternate crystal structures. Opposite sign surface charge between the different species of particles helps order an AB structure. Still other embodiments confine the structure to form waveguides by a variety of well-known methods, including: burying a solid core within the structure, forming the opal within grooves or around walls, or by laser trapping. All of these methods benefit from the annealing force removing defects.

An inverse opal structure is created by electrodepositing a metal within the opal micromould form and then removing the template. The metal may be any metal, metal alloy, or other chemical composition with a high index of refraction in contrast with vacuum/air. For an optimum plating method, the colloidal suspension of spheres used when forming the opal mould includes an electroplating electrolyte. Because the electrolyte is present during sedimentation, the applied electric potential for sedimentation should be limited to a level below that of the work function of the electrolytic deposition reaction to prevent electrodeposition of the metal during formation of the opal structure itself. Also, the electrolyte changes the colloid stability and appropriate adjustments should be made to maintain steric stability. An advantage is that since the electrolyte has already infiltrated the interstitial space between the spheres, a separate infiltration step, drying, and further handling are not necessary, thereby reducing the risk of damage. Another advantage is that this method does not require the use of toxic CVD gasses or hydrofluoric acid, nor the use of vacuum pressures during fabrication. Yet another advantage is polystyrene spheres are readily manufactured with magnetic cores and easily dissolved by toluene or may be removed by sintering. In alternative embodiments, electroless deposition is used.

The inverse opal PBG structure formed may not have all of the desired PBG properties. It is well known that changing lattice parameters by necking can optimize the band width of the PBG. Necking between the spheres can be achieved by chemically etching the inverse opal. In alternative embodiments, Physical Vapor Deposition (PVD) may be used to remove some material within the inverse opal, widening the necks between spheres. Alternatively, necking may also be accomplished by heating or slightly dissolving the template. This slight fusion increases structural integrity, which is particularly desirable for artificial opal gemstones. Optionally, a shell may be deposited over the necked inverse opal structure. This allows the addition of materials deposited by CVD, diffusion, electroless deposition, or chemical reaction, which are incompatible with polystyrene. To enhance complex dielectric constant contrast, the deposition thickness should be one skin depth or more to gain the optical performance of the added material. Additionally, the shell may present an evaporation or reaction barrier to the core material.

A PBG crystal based on a self-assembled structure may be heated, forming an incandescent light source. While it is well known that heated PBG structures lead to very high luminous efficacies due to shaped thermally-stimulated optical emissions, only self-assembled structures offer cost points required for use in commodity markets. Inverse opals are particularly easy to assemble directly onto a filament using the described method. Optionally, the use of an easily electroplated core material, such as Copper, optionally slightly etched, then CVD coated in a Molybdenum or Tungsten shell presents an evaporation barrier to the core material. Alternatively, a diffusion reaction may be beneficial, such as depositing a silicon shell and converting the silicon to silicon carbide. The PBG light source may be packaged in a standard bulb with a standard Edison base and powered by standard line voltage. Alternatively, a filament may be packaged within a fluorescent style tube, providing a socket compatible mercury-free replacement. The filament may be segmented into multiple PBGs housed within a common glass tube. The PBG light source gains its advantage in narrowband optical emissions. However, if the emissions are sufficiently narrow, poor color rendering will occur. Multiple PBG filaments of different wavelengths may be incorporated into the same bulb to allow electronic color shifting. For example, from photopic to scotopic color rendering.

Low-cost, high quality, mass-producable, self-assembled structures, opal structures, inverse opal structures, PBG crystals, and light emitters are needed to open many more applications to commercial viability. Some applications which benefit include: low-cost photonic crystals for applications such as lighting and TPV generation; other photonic crystal applications including: thermal signature modification, filters, prisms, negative refraction index surfaces, and lasers; chemical and mechanical functions including: strain gauges, chemical sensors, temperature sensors, chemical separation processes, gas storage, colorants, water repellants, catalytic supports and surfaces, lightweight structural materials; thermal and acoustic insulators; electrical functions such as: low-dielectric materials, thermoelectrics, and thermionics; electronic displays, such as: arrays of light emitters or electrically-tunable opals; photonic papers, and synthetic gemstones.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following detailed description, taken in conjunction with the accompanying drawings, in which.

DETAILED DESCRIPTION OF EMBODIMENTS OF THE INVENTION

Embodiments of the present invention and their advantages are best understood by referring to FIGS. 1 through 6 of the drawings, in which like numerals refer to like parts.

Figure 1A:
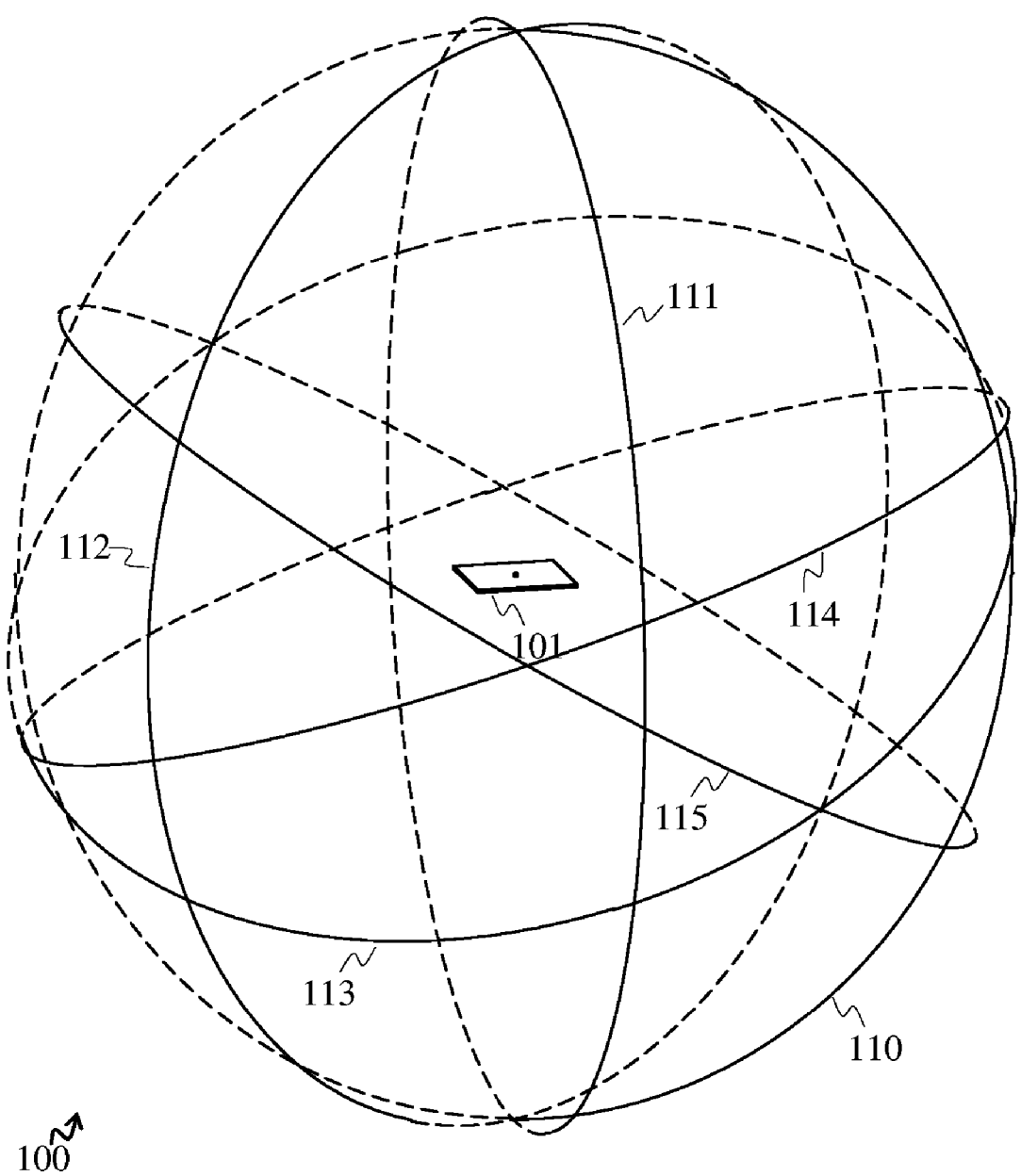
FIG. 1A is a diagram illustrating a perspective view of a self-assembly cell.
Figure 1B:
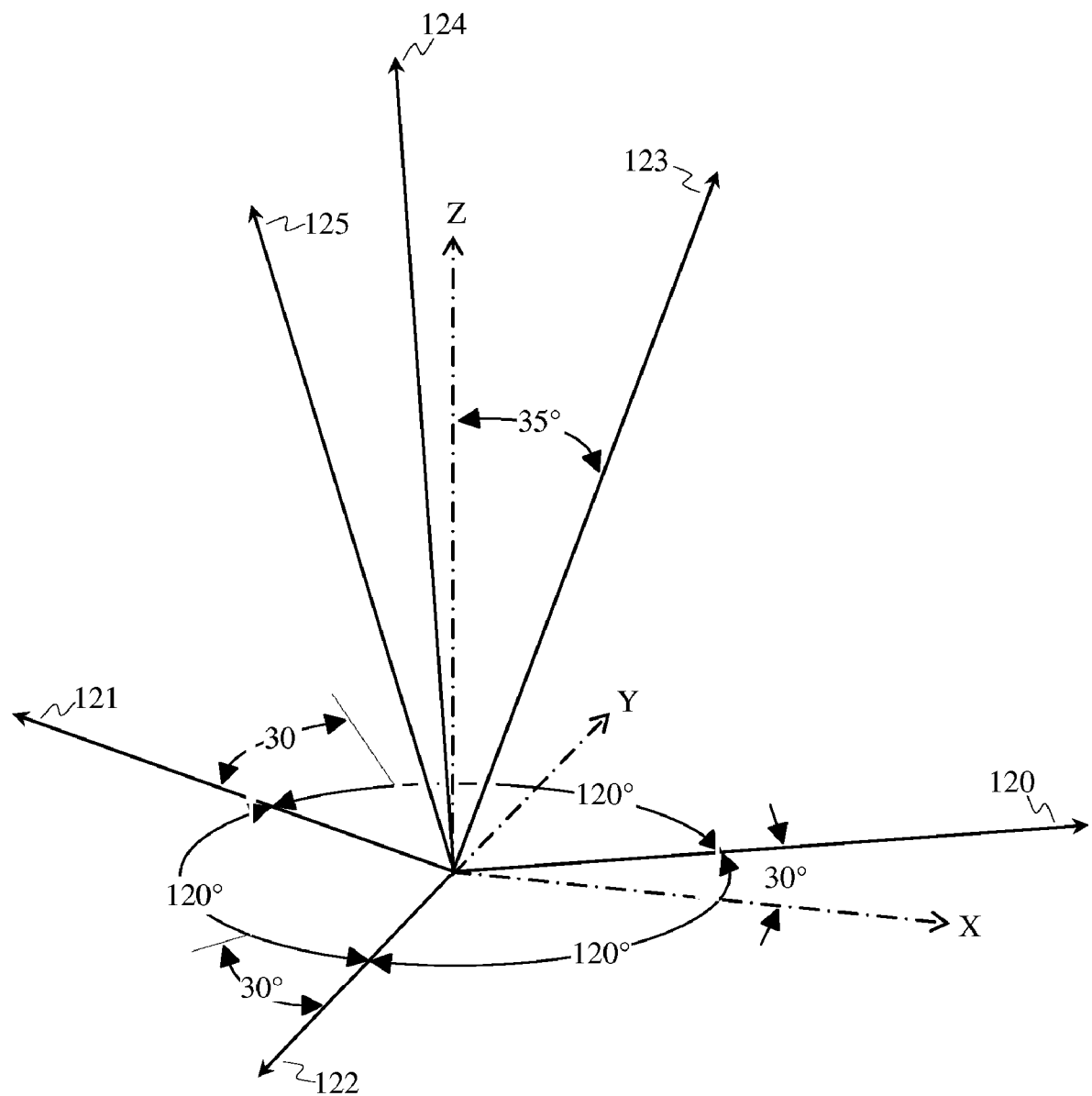
FIG. 1B is a perspective diagram indicating the axes of said self-assembly cell.

FIG. 1A is a diagram illustrating a perspective view of self-assembly cell 100. FIG. 1B is a perspective diagram indicating the axes of self-assembly cell 100. Self-assembly cell 100 has six yoke electromagnets 110 through 115 oriented along axes 120 through 125 to apply a magnetic force corresponding to the vector addition of the applied fields from each magnet. Axes 120 through 125 correspond to the well-known crystallographic axes of an opal structure. The direction of the magnetic field is electrically modulated between electromagnets 110 through 115. Alternatively, a single electromagnet may be used and mechanically rotated through the desired modulation pattern. Sample 101 is located inside self-assembly cell 100. Sample 101 contains a colloidal suspension of surface-charged paramagnetic spheres.

Figure 2:
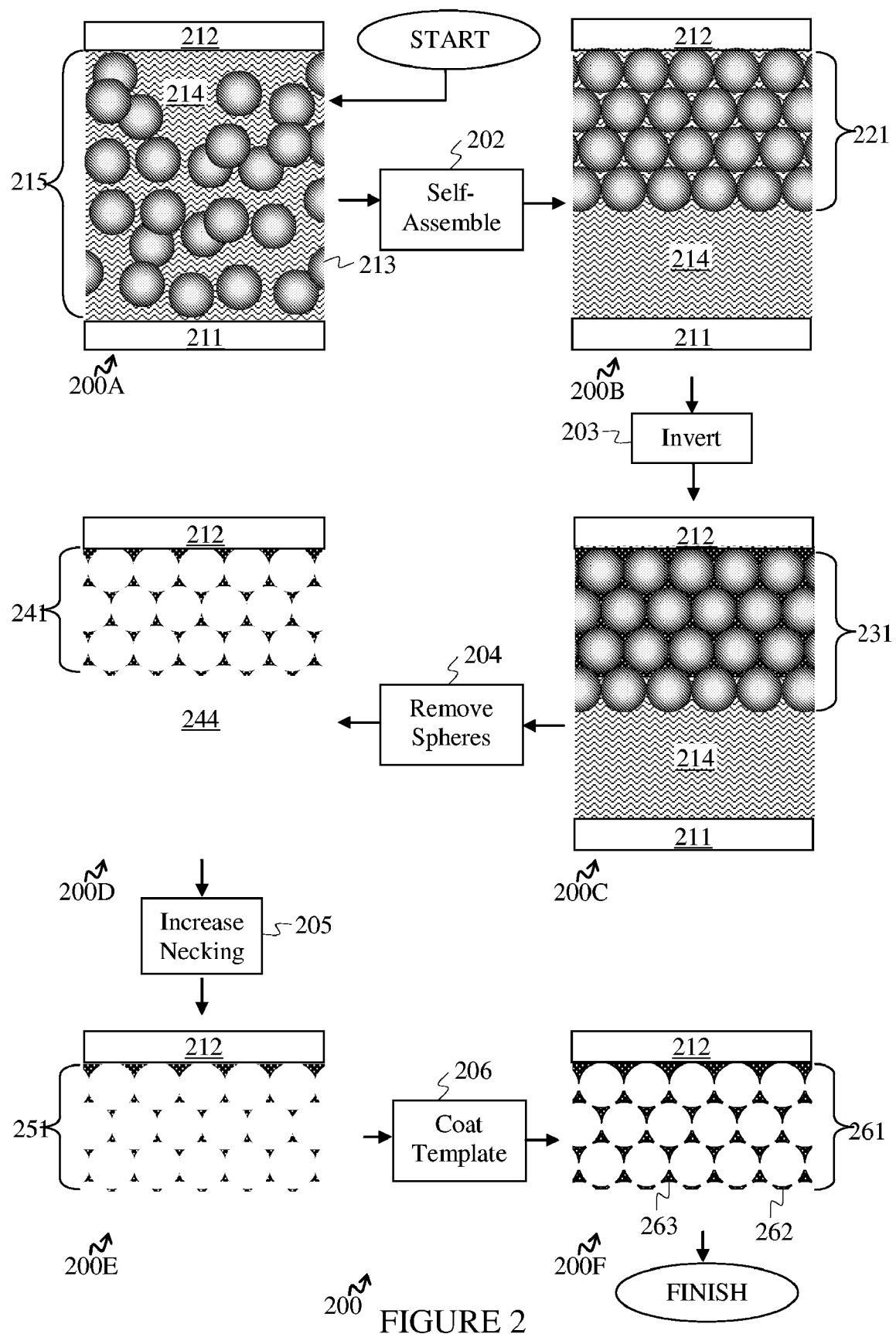
FIG. 2 is a flowchart with diagrams illustrating the side view of an electroplated inverse opal PBG crystal during fabrication.

FIG. 2 is a flowchart of method 200 with diagrams illustrating the side view of an electroplated inverse opal PBG crystal during the various steps of fabrication. FIG. 2 is for illustrative purposes and is not to scale. Sample 200A through 200F are exploded views of sample 101.

Sample 200A contains colloidal suspension 215 between anode 211 and cathode 212. Colloidal suspension 215 comprises suspending agent 214 and spheres 213. The sedimentation rate can be changed by adjusting the zeta potential, viscosity, or specific gravity of colloidal suspension 215. Zeta potential can be adjusted with changes in pH, ions, and with surface chemistry, such as a surfactant. Suspending agent 214 is an electroplating electrolyte selected based on the inversion material. Suspending agent 214 may be adjusted for the desired electroplating properties and colloid stability. Spheres 213 are monodisperse, polystyrene, magnetically functionalized spheres. Selected diameter of spheres 213 is generally in the range of 300 nm to 2 µm, depending on the optical wavelengths desired. Such spheres are well known for their use in biological separations. In an alternate embodiment, AB or other crystalline structures may be fabricated. Spheres 213 are mixed in the appropriate ratio of A type and B type species of particles. The particles may substantially differ in size, non-spherical shape, material composition and/or other functionality. A and B type particles may be selected for their affinity of the opposite type and disaffinity for their own type based on surface charge or other physical parameter. A and B type particles may even be bonded together as pairs before self-assembly, as the sedimenting and annealing fields are capable of assembling assemblies of particles. AB structures may offer improved PBG performance. In another alternate embodiment, an opal gemstone is desired and spheres 213 are comprised of silica while suspending agent 214 is simply water.

In step 202, spheres 213 are self-assembled by simultaneously applying both a sedimenting field and an annealing field. Force on each sphere is a summation of the electric force, magnetic force, Archimedes force, gravitational force, and Brownian movement. The rate of sedimentation is a function of the viscosity of the suspending fluid and applied forces, to obtain the desired quality. The sedimenting field is an electric field applied between anode 211 and cathode 212. The electric field may include both DC and AC components. Neither anode 211 nor cathode 212 need be flat plates; they may be wire, coiled wire, coiled coils of wire, ribbon, tubular, include walls or channels, or any other shape. Orientation of anode 211 and cathode 212 may be such to create sediments in any orientation. The applied sedimentation electrophoretic electric potential should be kept less than the electrodeposition voltage. With a low pH, required for a subsequent electroplating process, spheres 213 have a positive zeta potential and are attracted to cathode 212.

An oscillatory magnetic annealing field is simultaneously applied with electromagnets 110 through 115 to begin to establish a degree of initial order during the early stages of sedimentation and to provide sufficient energy to overcome the energy wells created by defects arising from fast sedimentation. The oscillatory magnetic field is also spatially swept, with preference to planes corresponding to opal crystallographic axes. The magnetic field may contain many varieties of modulation. Spheres 213 prefer to organize into an opal structure, as it provides the lowest free energy potential. The sedimentation and annealing rates should be carefully coordinated to ensure defects are removed before they become buried within the crystal where they are very difficult to remove. The annealing field is key to maintaining a low defect rate while maintaining a fast sedimentation rate. Directing the magnetic annealing force along the opal crystallographic axes has a unique advantage in aligning otherwise equal energy domains separated by twinning or stacking faults. Point defects are also removed. After self-assembly is complete, the annealing field is removed, but the sedimenting field is maintained to provide maximum durability through the remainder of the process. Also, stability may be enhanced by applying a sufficiently high potential, forcing adjacent spheres close enough to overcome repulsive double layer forces and establish a stable Van der Walls bond. Alternatively, light or heat activated chemical bonds may be used to stabilize the structure. This results in sample 200B. In an alternate embodiment, the magnetic spheres and non-magnetic suspending fluid are reversed, employing a magnetic suspending fluid with non-magnetic spheres.

In alternate embodiments, depending on the type of particle selected, the sedimentation and annealing fields may be substituted for or combined with mechanical agitation or gravitational, centrifugal, or thermal fields so long as both a sedimentation force and an annealing force are maintained. For example, an electric field may serve as a sedimenting field while a induced flow field, predominantly in one or more crystallographic axes, serves as an annealing field. For example, an electric field may serve as both a sedimenting field and an annealing field, if the field vector generally points toward the substrate, but is varied in magnitude and direction with preference for the crystallographic axes of the crystal. Laser confinement may selectively sediment only selected areas of the substrate.

In sample 200B, all of spheres 213, have ordered into opal 221. Opal 221 is a PC, but it does not have a PBG. Thickness of opal 221 may be controlled by varying the number of spheres initially in colloidal suspension 215. If a synthetic opal gemstone is the desired outcome, the sample may be dried and fused at this point. Alternatively, removable structures in the shape of an optical waveguide, optical coupler, optical splitter, or other structure may be encased in the opal, or the substrate may be structured to contain these shapes. In yet another alternate embodiment, cathode 212 may be micropatterned to grow other non-opal structures of packed spheres on a templated substrate, including: alternate axis hexagonal close packed, face-centered cubic, body-centered cubic, diamond lattice, and the hexagonal $AB_2$ structure. Some structures, such as an opal, do not require a templated substrate.

In step 203, opal 221 is inverted. An electroplatable metal, metal alloy, semiconductor alloy, or precursor material is electrodeposited, completely filling the interstitial gaps of opal 221, forming inverted opal with spheres 231 illustrated in sample 200C. The applied electrodeposition voltage does not disrupt opal 221, as the sedimentation voltage is of the same polarity. For PBG applications, the electroplated material should exhibit a high refractive index relative to vacuum/ air. In one embodiment, the metal is Copper, selected for its good refractive index, ease of use, and environmental friendliness. The quality of deposits may be difficult to maintain, as agitation is not possible within the deep recesses of an opal template. Periodic pulse reverse plating helps maintain deposition quality. Reverse plating pulse width and duration should be selected not to disrupt the opal structure. Application of a static magnetic field aids in minimizing disruption from the reverse plating pulse. The plated structure is rugged enough to be handled without damage. Advantages include minimizing damage of the opal structure, since: the electrolyte is infiltrated into the crystal before assembly, and the sample is electroplated without movement from the sedimentation and annealing step. Additional advantages include: no voids in the inverted crystal due to incomplete infiltration, use of minimally hazardous materials, and low processing cost. Other micromoulding techniques can be utilized, such as: electroless deposition, particle infiltration, CVD, chemical precipitation, or chemical conversion. In an alternate embodiment, the voids contain an epoxy or other setting compound incorporated into the colloidal suspension.

In step 204, anode 211 is discarded, cathode 212 remains as a substrate, and spheres 213 are removed, resulting in inverse opal 241 on substrate 212. Polystyrene spheres are readily dissolved with solvent 244, such as toluene, or by sintering. In an alternate embodiment using silica spheres, hydrofluoric acid is required.

Sample 200D shows inverse opal 241 on substrate 212. This structure exhibits a full 3-D PBG. In an alternate embodiment, if an inverse opal without a substrate is desired, substrate 212 may be chosen to be a different material from inverse opal 241 and removed by selective etching. A subsequent Chemical Mechanical Polish or Reactive Ion Etch may be desired, as the layer of inverse opal 241 closest to cathode 212 is incomplete due to previous contact with cathode 212.

In step 205, the necking between cavities is increased to modify the PBG gap width. Some small thickness of material is uniformly removed by chemical etch. For example, Cu can be removed with sodium persulfate. Alternatively, the material can be heated for PVD removal.

Sample 200E shows necked inverse opal 251. If desired PBG and physical parameters have been met, processing is complete. If thermal stimulation is not required, the process is complete.

In step 206, necked inverse opal 251 is coated to improve physical or optical characteristics. Improvement of optical characteristics may be desired if a lower physical performance material was used as the inverse core for other reasons. Physical characteristics may be improved by deposition of an evaporation barrier. This is especially important in thermally-stimulated optical emitters, such as are required in TPV electric generators and for PBG-based incandescent light bulbs. For example, Cu heated to high temperature will rapidly oxidize in air and will evaporate in vacuum. A refractory metal evaporation barrier is CVD deposited over the Cu core, allowing high-temperature operation. Alternate embodiments readily use alternative materials in both the shell and the core. In one alternative embodiment, a thin layer of W is deposited over a high index material, such as Ge or GaSb, resulting in a higher index structure than a solid W structure. Any well-known means of depositing a material, alloying, or chemical reaction may be considered, such as CVD, diffusion, or electroless deposition.

Sample 200F shows coated inverse opal 261, including coating 263 over core 262, and cathode 212 as a substrate. This PBG structure is ready to be packaged as required by the application.

Figure 3:
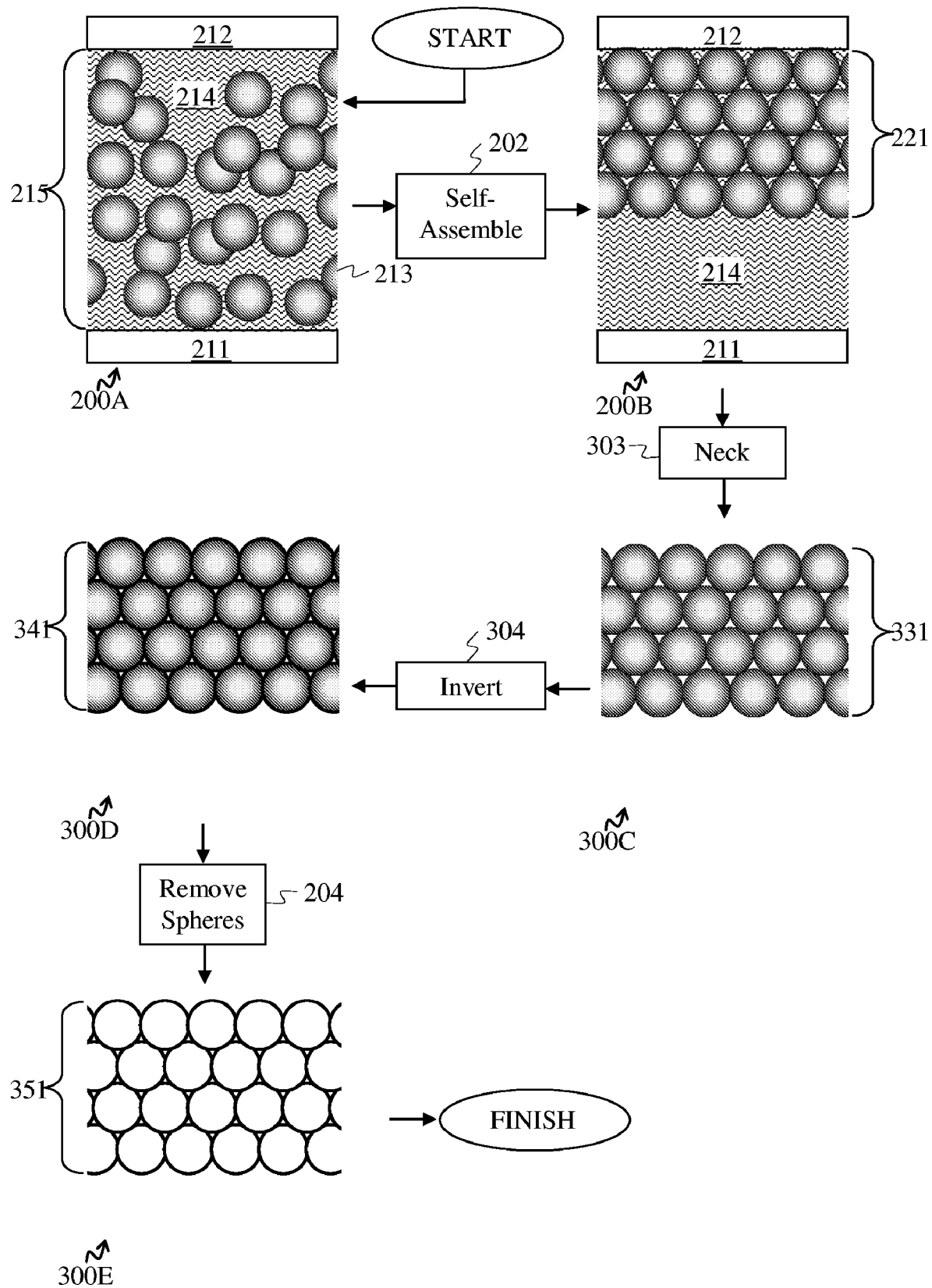
FIG. 3 is a flowchart with diagrams illustrating the side view of a CVD inverse opal PBG crystal during fabrication.

FIG. 3 is a flowchart with diagrams illustrating the side view of an alternate embodiment, a CVD inverse opal PBG crystal during fabrication. FIG. 3 is for illustrative purposes and is not to scale.

The initial sample 200A, sedimentation in step 202, and sample 200B are the same as shown under FIG. 2.

Step 303 removes anode 211, dries opal 221, and heats opal 221 to cause fusion at the contact points between spheres 213. The degree of necking introduced influences the mechanical strength and optical properties of the PBG crystal. Polystyrene spheres require minimal heat for fusion. Other sphere materials such as silica require sintering for fusion. In an alternative embodiment, a solvent is introduced, softening spheres 213 to promote necking, and the solvent is then removed by drying. Cathode 212 is required for structural stability during drying and may be removed chemically or mechanically after fusion. The process is complete if an opal is the desired endpoint.

Sample 300C illustrates necked opal 331.

Step 304 inverts necked opal 331 through a well-known CVD process. In alternative embodiments, electroless deposition may be used. This process does not completely fill the interstitial voids between spheres 213. This may be an advantage depending on the required optical properties.

Sample 300D illustrates inverted opal with spheres 341.

Step 204 removes spheres 213 by well-known processes. Polystyrene spheres are readily sintered or dissolved by toluene, whereas silica requires hydrofluoric acid.

Sample 300E shows a CVD inverse opal 351.

Figure 4A:
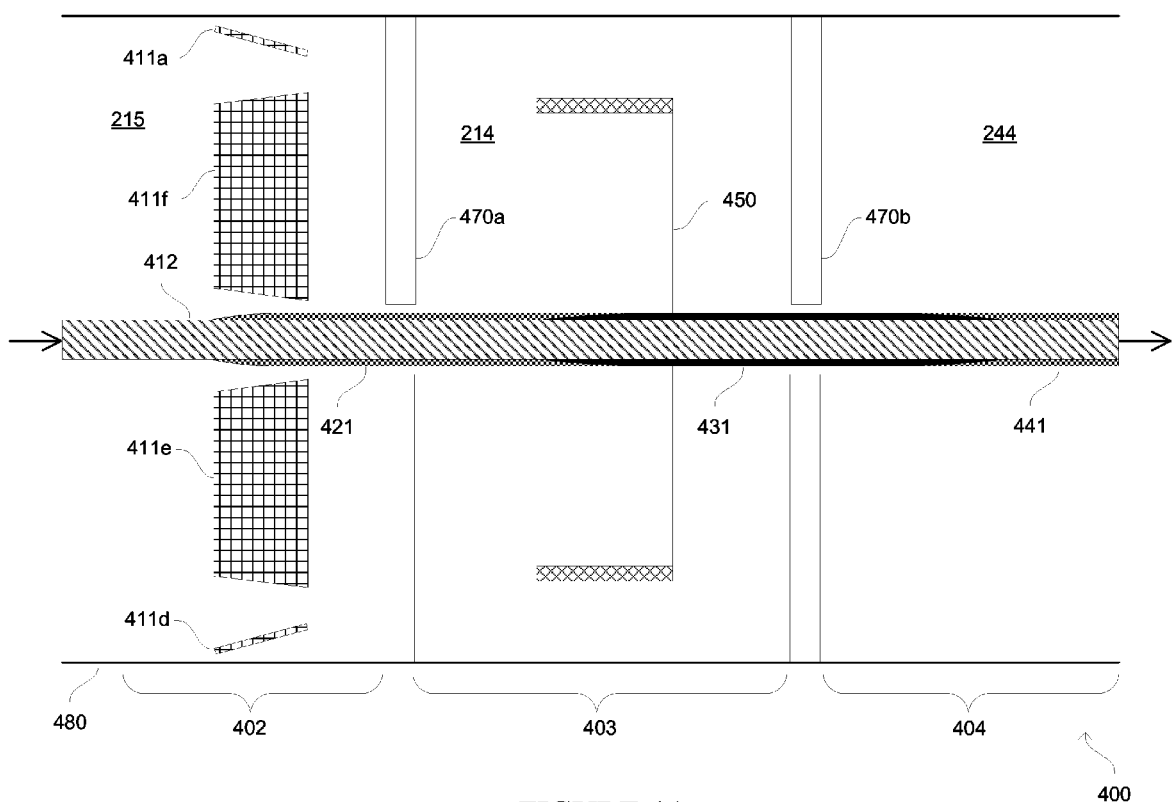
FIG. 4A is a diagram illustrating a cross-section of an alternate embodiment of a self-assembly cell.
Figure 4B:
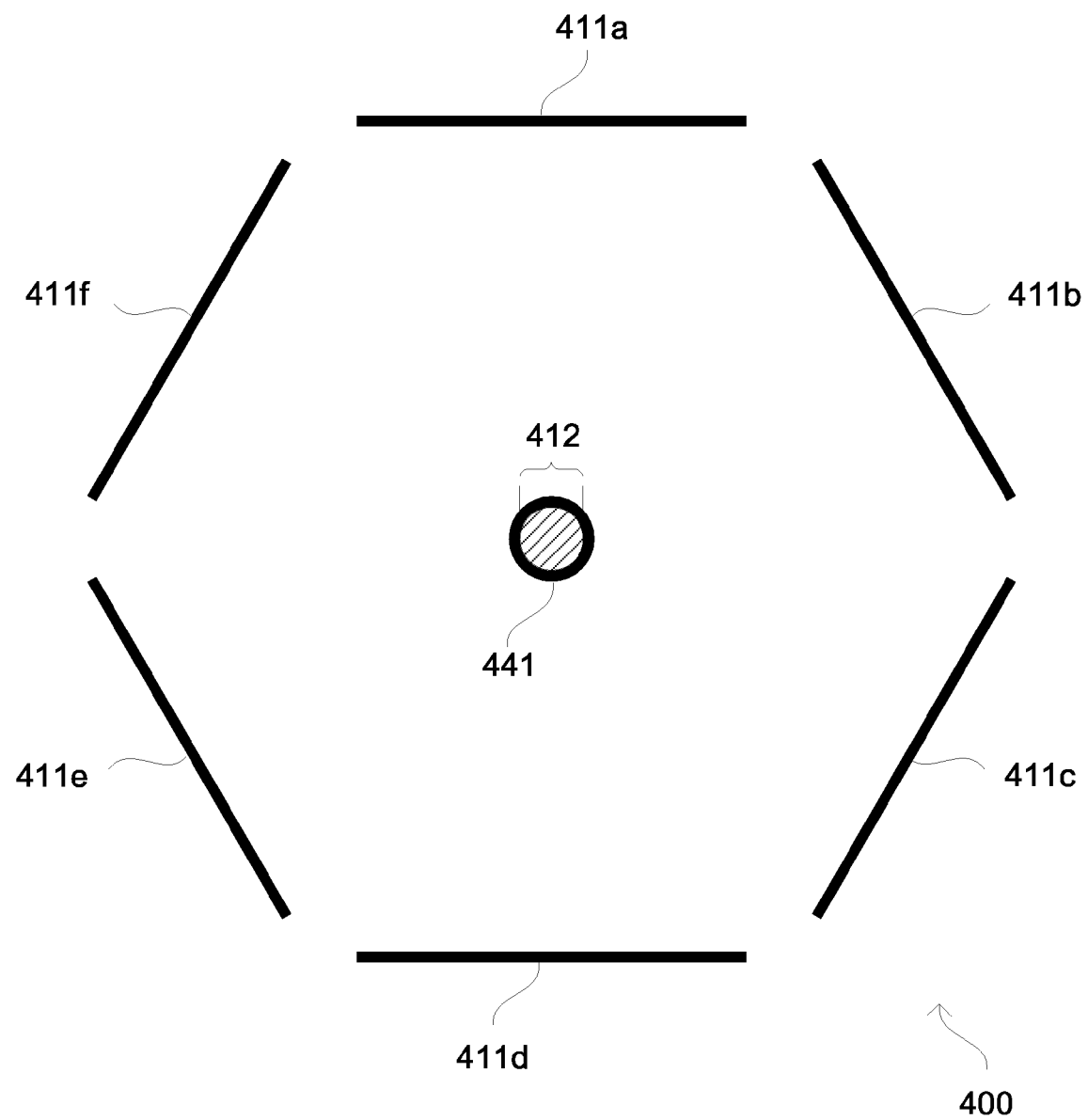
FIG. 4B is an inset diagram illustrating a cross-section of electrodes in the self-assembly cell.

FIG. 4A is a diagram illustrating a cross-section of an alternate embodiment of a self-assembly cell. FIG. 4B is an inset diagram illustrating a cross-section of electrodes in self-assembly cell. PBG assembly cell 200 continuously assembles an inverse opal 441 onto a filament 412 in a continuous roll-to-roll fashion. PBG assembly cell 400 is segmented into an opal self-assembly cell 402, an insulating divider wall 470a, an electrodeposition cell 403, a divider wall 470b, and an opal removal cell 404 in tank 480. Additional cells for necking and shelling may be added, or cells removed, depending on the desired end product. Filament 412 is a fine wire or sheet and is not shown to scale for clarity. Source and take-up reels at each end are not shown for clarity.

Electrodes 411a-f provide an oscillatory electric field in reference to grounded filament 412. Electrodes 411 may be inclined to give an increasing field as the self-assembly progresses. Electrodes 411a-f are oriented along the crystallographic axes of opal 421. Additional sets of electrodes 411 and insulators may be added to create off-axis field vectors. The field is modulated between all electrodes 411a-f to simultaneously attract spheres from colloidal suspension 215 to filament 412 and anneal out defects caused by rapid sedimentation during the opal self-assembly. This results in self-assembled opal 421 completely encasing filament 412; a small segment is shown as opal 221. In an alternative embodiment, electrodes 411a-f may be replaced with a single electrode and magnets may provide the modulated annealing field.

A metal is electrodeposited in the interstitial voids of opal 421 via ring anode 450 and electrolyte 214. The width of anode 450 is selected to give the desired plating thickness given the feed rate of filament 412. Anode 450 may be rotated and electroplating current pulsed, reverse pulsed, or otherwise modulated to improve the plating quality. This results in inverted opal with spheres 431, a small segment is shown as inverted opal with spheres 231. Inverted opal with spheres 431 is placed in a solvent 244, removing opal 421, resulting in inverse opal 441, a small segment is shown as inverse opal 241.

In an alternate embodiment, a magnetic field assists the self assembly, as illustrated in FIGS. 1 and 2. In another alternate embodiment, spheres may be any shape of particle, the particle suspension may contain a mixture of different species of particles, and the self-assembled structure may have a diamond lattice or other crystal structure. Electrodes 411 are varied in quantity, geometry, and position to match the crystallographic axes of the desired structure.

Figure 5:
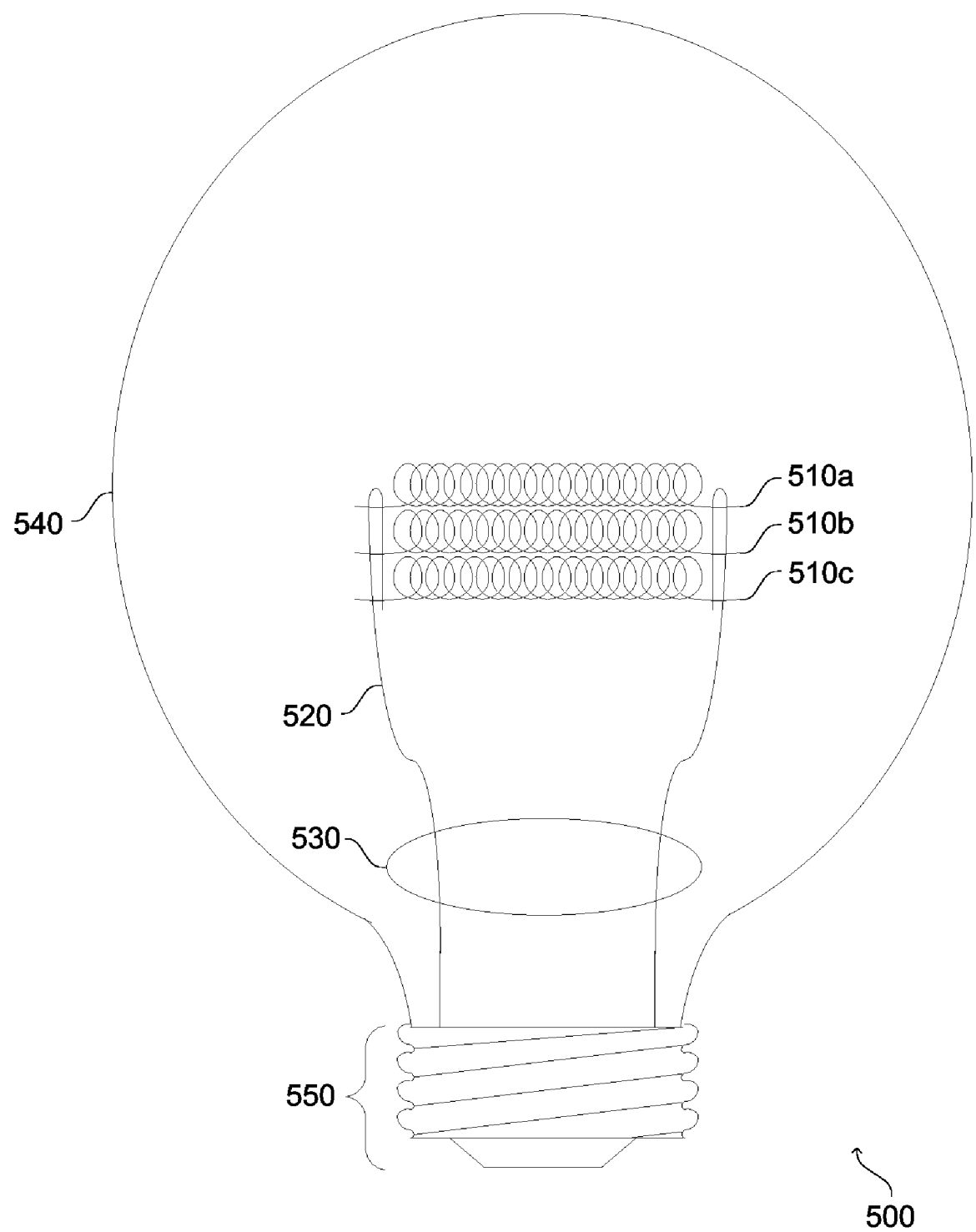
FIG. 5 is a diagram illustrating a PBG incandescent light bulb.

FIG. 5 is a diagram illustrating a PBG incandescent light bulb 500. A PBG is self-assembled onto a filament 510 using method 200. Filament 510 may be a wire or a ribbon, a small section of which is shown as cathode 212 in method 200. One or more filaments 510a-c may each have different color output and are combined to improve color rendering. Alternatively, to improve color rendering, the PBG gap width may be decreased, resulting in a more inefficient bulb. Filaments 510a-c may each have a different resistance to produce the desired color weighting. Resistance is selected by changing filament wire substrate diameter, length, or material, or by removing the wire substrate entirely, or by PBG materials or thickness. In an alternate embodiment, each filament 510a-c may have an independent electrical connection, allowing electronic color control or for dynamic switching between photopic and scotopic color weighting. In an alternate embodiment, filaments 510a-c are co-axially wound. Filaments 510a-c are connected to well-known support wires 520, mounted in a well-known glass base 530, inside of a well-known glass envelope 540, filled with a gas or vacuum, and fitted with an industry standard Edison or A-line base 550. Envelope 540 may employ a well-known IR filter to further improve efficiency, redirecting heat to filament 510. Since filament 510 does not operate as a black body, filament 510 temperature may be lowered with a minimal loss of efficiency. Decreased operating temperature allows the use of a broader selection of PBG materials, trading increased vapor pressure for increased complex dielectric constant. A significant advantage, the efficiency does not drop as dramatically with temperature, the operating temperature may be lowered from a well-known filament temperature of 2500° C. to 3000° C. down to 1500° C. or less, thereby extending bulb life. The length of filament 510 may be adjusted to give the desired optical output power. In an alternate embodiment, PBG properties may be selected to emit IR for applications such as heat lamps and thermal beacons. Advantages include a dramatically improved efficiency, socket compatibility with existing bulbs, low cost, and simple fabrication.

Figure 6:
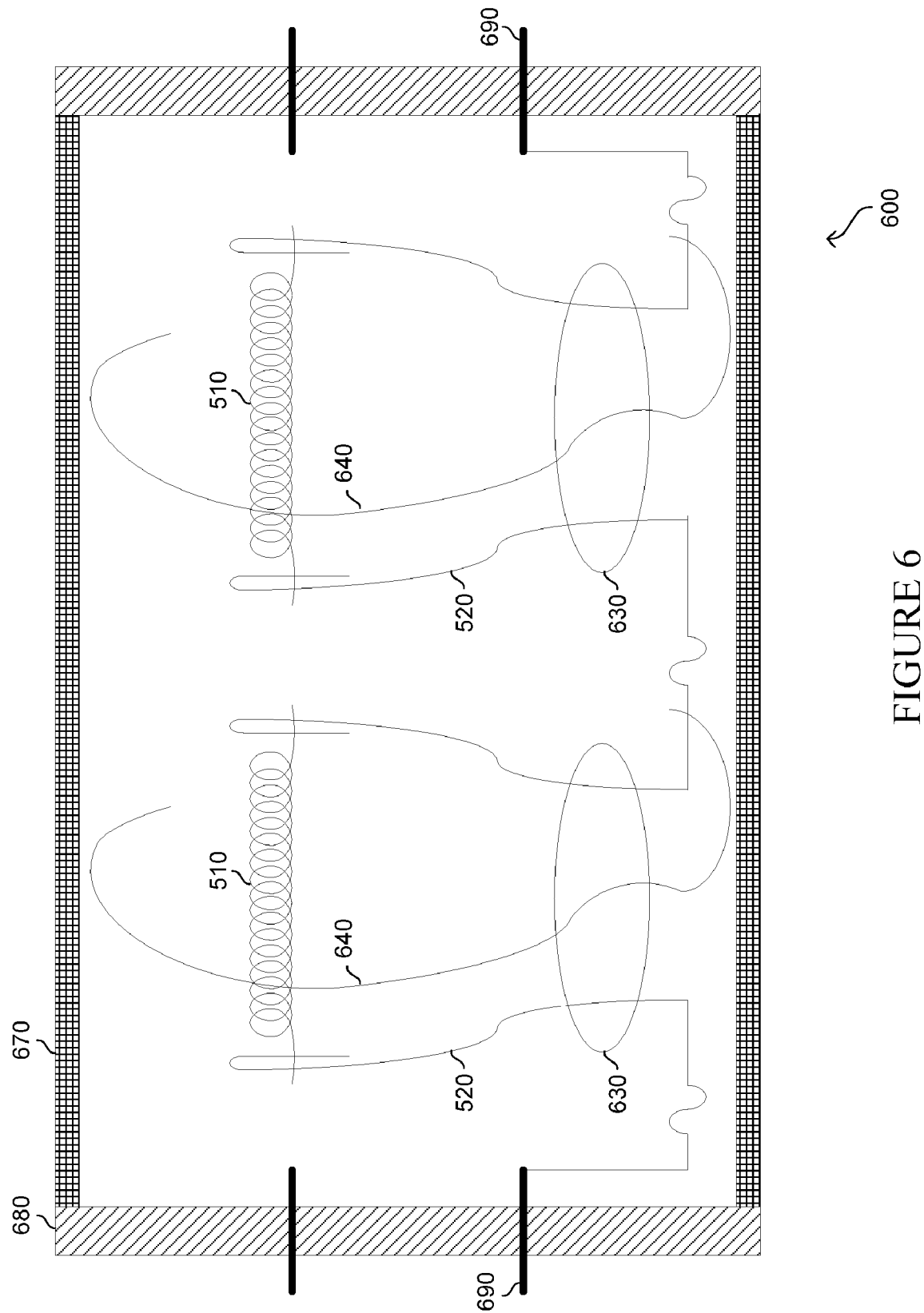
FIG. 6 is a diagram illustrating a PBG incandescent light bulb in a tubular envelope, in accordance with the present invention.

FIG. 6 is a diagram illustrating a PBG incandescent light bulb 600 in a tubular glass envelope. A PBG filament 510 is attached to support wire 520, and is attached to a glass base 630. Base 630 also contains a support wire 640 to maintain the position of filament 510 to prevent contact with glass tube 670 and to prevent breakage of filament 510. A multitude of filaments 510 may be contained within a single tube 670 to provide the desired light output. Alternatively, a single filament may stretch from one end of tube 670 to the other. A multitude of support wire 640 are modified to loosely contact the filament and should be spaced such that the filament will not sag and contact tube 670. End cap 680 and pins 690 are selected to allow drop-in replacement of a standard two-pin fluorescent bulb. PBG bulb 600 is designed to operate in a standard fluorescent fixture at a higher efficiency than a standard fluorescent bulb and without the use of Mercury. The standard fixture's ballast no longer performs a useful function.

Although embodiments of the invention and their advantages are described in detail, a person skilled in the art could make various alterations, additions, and omissions without departing from the spirit and scope of the present invention as defined by the appended claims.

What is claimed is:

1. A method of forming a colloidal crystal comprising:
   providing a colloidal suspension of colloidal particles, where said particles have a surface charge;
   providing a continuous wire substrate;
   ordering said particles into a colloidal crystalline structure on the surface of said substrate, including:
      a sedimentation means for electrophoretically directing said particles towards said substrate;
      an annealing means for actively removing defects concurrently with formation of said sedimentation, where said force is oscillatory in magnitude and the direction of said force is varied between multiple crystallographic axes of said crystal;
      where said annealing means includes a multitude of hydrophones operable to apply a force to said particles,
      where one or more hydrophones are positioned on each crystallographic axis, and
      where said means for annealing defects operates at a faster rate than additional said particles are sedimented from said suspension; and
      where the rate of both said sedimentation and of said annealing are selected as to result in fewer defects in said crystal than without simultaneously applying said sedimentation and annealing means;
   continuously mechanically advancing said substrate past the area of the intersection of said annealing oscillations, as to maintain the growth front near said area of intersection of said oscillations, and limiting said sedimentation means in other areas;
   a means for adding material within the interstitial voids of said colloidal crystal, where said interstitial material is selected from the group of high temperature refractory materials,
   removing said original colloidal crystal, resulting in a colloidal crystal of air/refractory composition; and
   packaging said refractory colloidal crystal in a bulb.

\* \* \* \* \*